United States Patent

Geyling et al.

[11] Patent Number: 5,881,208
[45] Date of Patent: *Mar. 9, 1999

[54] HEATER AND TEMPERATURE SENSOR ARRAY FOR RAPID THERMAL PROCESSING THERMAL CORE

[75] Inventors: Franz Geyling, Austin, Tex.; Thomas J. Jasinski, Lebanon, N.H.

[73] Assignee: Sematech, Inc., Austin, Tex.

[*] Notice: This patent issued on a continued prosecution application filed under 37 CFR 1.53(d), and is subject to the twenty year patent term provisions of 35 U.S.C. 154(a)(2).

[21] Appl. No.: 580,081

[22] Filed: Dec. 20, 1995

[51] Int. Cl.$^6$ .................................................... F26B 3/30
[52] U.S. Cl. ............................................................ 392/418
[58] Field of Search .................................. 392/416, 418, 392/407; 374/126, 128, 131, 121; 219/405

[56] References Cited

U.S. PATENT DOCUMENTS

| | | | |
|---|---|---|---|
| 3,895,216 | 7/1975 | Hurko | 219/462 |
| 4,139,051 | 2/1979 | Jones et al. | 165/1 |
| 4,518,848 | 5/1985 | Weber | 219/288 |
| 4,535,834 | 8/1985 | Turner | 165/80 |
| 4,857,689 | 8/1989 | Lee | 219/10.71 |
| 4,909,314 | 3/1990 | Lamont, Jr. | 165/80.3 |
| 4,924,073 | 5/1990 | Chiba | 219/413 |
| 5,059,770 | 10/1991 | Mahawili | 219/391 |
| 5,060,354 | 10/1991 | Chizinsky | 29/25.02 |
| 5,078,851 | 1/1992 | Nishihata et al. | 204/298.34 |
| 5,090,900 | 2/1992 | Rudolf et al. | 432/239 |
| 5,106,200 | 4/1992 | Hosokawa | 374/121 |
| 5,133,829 | 7/1992 | Geyling | 156/603 |
| 5,151,871 | 9/1992 | Matsumura et al. | 364/557 |
| 5,161,717 | 11/1992 | Geyling | 222/146.2 |

(List continued on next page.)

FOREIGN PATENT DOCUMENTS

| | | |
|---|---|---|
| 60-148111 | 5/1985 | Japan . |
| 63-148623 | 6/1988 | Japan . |
| 3-82035 | 8/1991 | Japan . |
| 3-229442 | 11/1991 | Japan . |
| 4-286326 | 12/1992 | Japan . |
| 5-29264 | 5/1993 | Japan . |

OTHER PUBLICATIONS

U.S. patent application Ser. No. 08/970,309 filed Nov. 14, 1997.
U.S. patent application Ser. No. 08/575,749 filed Dec. 20, 1995.
U.S. patent application Ser. No. 08/715,078 filed Sep. 19, 1996.
U.S. patent application Ser. No. 08/575,812 filed Dec. 20, 1995.

*Primary Examiner*—Adolf Berhane
*Attorney, Agent, or Firm*—Arnold, White & Durkee

[57] ABSTRACT

An apparatus for rapid thermal processing of silicon wafers is provided. The apparatus may include a heating element, sensing element and a cooling element, all of which are positioned in opposing relation to a backside of a silicon wafer. A method of using the apparatus includes using the apparatus to rapidly heat a wafer, apply desired processing assists, and rapidly cool the wafer. The apparatus may also include an array of sensing elements which are interposed between heating elements. The sensing elements may be a combination of absolute and relative sensors. The array permits accurate zonal control of the heating elements and prevents cross talk between the heaters. The apparatus may be used to monitor the temperature at various points across a wafer and to control the associated heating elements in response to the monitoring step. The apparatus may also include a high speed rotating support for the wafer. Further, the apparatus may include a shroud surrounding the wafer which allows for more uniform processing across the wafer. Also, an inlet structure for introducing processing assists which contours to the shape of the shroud is disclosed. A method for using the apparatus includes utilizing the inlet structure to provide processing assists over the surface of a wafer and obtaining uniform depositions by aid of the shroud.

29 Claims, 11 Drawing Sheets

U.S. PATENT DOCUMENTS

| | | | |
|---|---|---|---|
| 5,171,398 | 12/1992 | Miyamoto | 156/552 |
| 5,178,840 | 1/1993 | Geyling | 422/247 |
| 5,198,034 | 3/1993 | de Boer et al. | 118/725 |
| 5,228,501 | 7/1993 | Tepman et al. | 165/80.1 |
| 5,238,499 | 8/1993 | van de Ven et al. | 118/724 |
| 5,246,532 | 9/1993 | Ishida | 156/345 |
| 5,252,807 | 10/1993 | Chizinsky | 219/390 |
| 5,290,381 | 3/1994 | Nozawa et al. | 156/345 |
| 5,305,417 | 4/1994 | Najm et al. | 392/418 |
| 5,315,092 | 5/1994 | Takahashi et al. | 219/497 |
| 5,343,012 | 8/1994 | Hardy et al. | 219/443 |
| 5,350,480 | 9/1994 | Gray | 156/345 |
| 5,367,606 | 11/1994 | Moslehi et al. | 392/418 |
| 5,370,739 | 12/1994 | Foster et al. | 118/725 |
| 5,436,172 | 7/1995 | Moslehi | 437/8 |
| 5,444,217 | 8/1995 | Moore et al. | 219/405 |
| 5,462,603 | 10/1995 | Murakami | 118/719 |
| 5,478,429 | 12/1995 | Komino et al. | 156/345 |
| 5,504,831 | 4/1996 | Sandhu et al. | 392/418 |
| 5,520,742 | 5/1996 | Ohkase | 118/724 |
| 5,527,393 | 6/1996 | Sato et al. | 118/725 |
| 5,536,918 | 7/1996 | Ohkase et al. | 219/390 |
| 5,556,476 | 9/1996 | Lei et al. | 118/728 |
| 5,566,744 | 10/1996 | Tepman | 165/80.1 |
| 5,580,388 | 12/1996 | Moore | 118/728 |
| 5,601,366 | 2/1997 | Paranjpe | 374/126 |
| 5,635,093 | 6/1997 | Arena et al. | 219/466 |
| 5,643,366 | 7/1997 | Somekh et al. | 118/721 |
| 5,660,472 | 8/1997 | Peuse et al. | 374/128 |
| 5,660,740 | 8/1997 | Komino | 216/67 |
| 5,676,869 | 10/1997 | Nakayama et al. | 219/390 |
| 5,688,331 | 11/1997 | Aruga et al. | 118/725 |

HEATER AND TEMPERATURE SENSOR ARRAY FOR RAPID THERMAL PROCESSING THERMAL CORE

BACKGROUND OF THE INVENTION

The present invention relates to thermal processing of semiconductor wafers. More specifically, the present invention relates to a method and apparatus for rapid thermal processing (RTP) of semiconductor wafers.

Semiconductor chip fabrication on silicon wafers requires many precisely controlled sequential steps to deposit, implant, diffuse, remove, or form key materials. During fabrication, thermal process steps include, for example, dielectric deposition, post-implant annealing, diffusion barrier formation, contact alloying, oxidation, oxide nitridation, and epitaxial silicon growth. During these process steps, the wafer temperature is elevated to enhance activation of the desired mechanisms. In the near future, further reduction of critical dimensions of integrated circuits from 0.35 microns to 0.18 microns and the implementation of shallower junctions will require tighter thermal processing temperature tolerances, from the present 10°–15° C. to 1°–2° C. Further, wafers are expected to increase in size from 200 mm to 300 mm.

To meet these requirements, thermal processing will increasingly shift from batch processing to single wafer Rapid Thermal Processing (RTP). In batch processing, many wafers are simultaneously processed and utilize relatively slow temperature transients and long cycle times. However, the temperatures experienced by each wafer depend on its location in the stack. Single wafer processing can potentially impose nearly identical wafer-to-wafer conditions, enhancing wafer-to-wafer reproducibility and allowing tighter temperature tolerances. However, to generate product throughputs comparable to batch furnaces, the RTP process must incorporate rapid heatups (50° to 100° C./s) and cool-downs, and higher process temperatures for shorter times, which increase difficulties of meeting temperature level and uniformity requirements.

In current commercial RTP systems, wafer heating is generally accomplished using electrically-powered lamp elements which radiate high intensity thermal energy from an extended distance onto the surface of the wafer. It would be desirable to utilize a more controllable heating technique, as lamp heating has several major disadvantages. First, it is difficult to irradiate the wafer uniformly and thereby attain a uniform wafer temperature. Second, the temperature of the wafer is generally measured pyrometrically, usually positioned outside the reactor. Pyrometric temperature measurement is difficult, though, because stray reflected and transmitted lamp radiation corrupts the pyrometer input, and because the effective emissivity of the wafer is often not accurately known and can change during the process. Other known RTP heating and measurement techniques, which fall into categories of optical heating/sensing, have similar disadvantages.

In contrast to RTP, chemical vapor deposition (CVD) and etch process steps in semiconductor fabrication are known to use a heated wafer chuck at constant temperature. The chuck is simply a flat surface of suitable material upon which the wafer rests, usually in the horizontal orientation. The chuck is generally heated from its backside (the wafer rests on the front side) by a number of means, such as electrical resistance heater element, RF induction, or lamp radiation. When necessary, the thermal design of the chuck incorporates temperature leveling to promote wafer temperature uniformity. The temperature of the chuck may be measured by a thermocouple, which is straightforwardly used as a process control variable. However, such heated chucks have not been implemented in RTP systems since these standard chucks generally have a thermal mass that is too large to permit ramp rates required for RTP applications.

There are three primary design considerations in implementing the reactor concept according to the present invention. First, through heating efficiency, there are minimal pattern effects by utilization of backside heating and the frontal shield. Second, there is high space-time resolution control, thereby permitting high control authority. Finally, high gas flow/mixing permits a high processing rate and increases throughput. This creates a high efficiency reactor that allows for quick switching between processing steps. Also, the showerhead edges may be curved to provide uniform downward gas flow. Further, the showerhead edges may be used as electrodes during plasma cleaning.

SUMMARY OF THE INVENTION

The objectives of the present invention are directed at the above described problems. More particularly, the apparatus and methods of the present invention present a thermal core and control mechanism which allows for the rapid heating and cooling required for RTP. Specifically, in one embodiment the apparatus of the present invention includes at least one heating element in opposed relation to a silicon wafer backside, at least one sensing element in opposed relation to a silicon wafer backside, and a cooling element in close relation to the heating element. The heating element may be comprised of, for example, a plurality of segmented resistive low-mass heaters. The sensing element may be comprised of, for example, a plurality of individual absolute and relative sensors. The cooling element may be, for example, a chiller block. The present invention also includes a method for using the apparatus which includes the steps of placing a silicon wafer in a reaction chamber, heating the silicon wafer to a desired temperature using the heating elements, determining the temperature using the sensing elements, applying processing chemicals to the silicon wafer, and cooling the silicon wafer by means of the cooling element.

In another embodiment, the apparatus of the present invention includes an array of sensing elements in opposite relation to a silicon wafer backside which are interposed between a plurality of heating elements. The arrangement of the sensing elements permits zonal control of the heating elements and eliminates cross talk between the heating elements. The sensing elements may further include, for example, a substantially hollow interior and be surrounded by shields to increase radiative coupling between the sensing element and the silicon wafer backside. The present invention also includes a method for using the apparatus, including the steps of placing a silicon wafer in a reaction chamber, heating the silicon wafer to a desired temperature and controlling the heating elements based on the sensor data.

In yet another embodiment, the present invention includes a wafer support platform on which to place a silicon wafer which is capable at rotating at high speeds to provide a uniform gas flow across the silicon wafer. Preferable speeds of approximately 800 to 1600 rpm and most preferably 1200 rpm may be utilized. The invention further includes a shroud which surrounds the silicon wafer, thereby providing a radially larger continuous horizontal surface, which thus increases the uniformity of processing across the wafer. Further, the present invention includes an inlet structure for introducing processing assists to the silicon wafer which conforms to the contours of the wafer support and shroud, thereby aiding in uniformity of processing. Further, the inlet structure of the present invention may be curved, thereby improving gas flow over the wafer, aiding in reflecting radiation, and providing for a mating electrode for plasma cleaning operations.

DETAILED DESCRIPTION OF THE PREFERRED EMBODIMENTS

Figure 1:
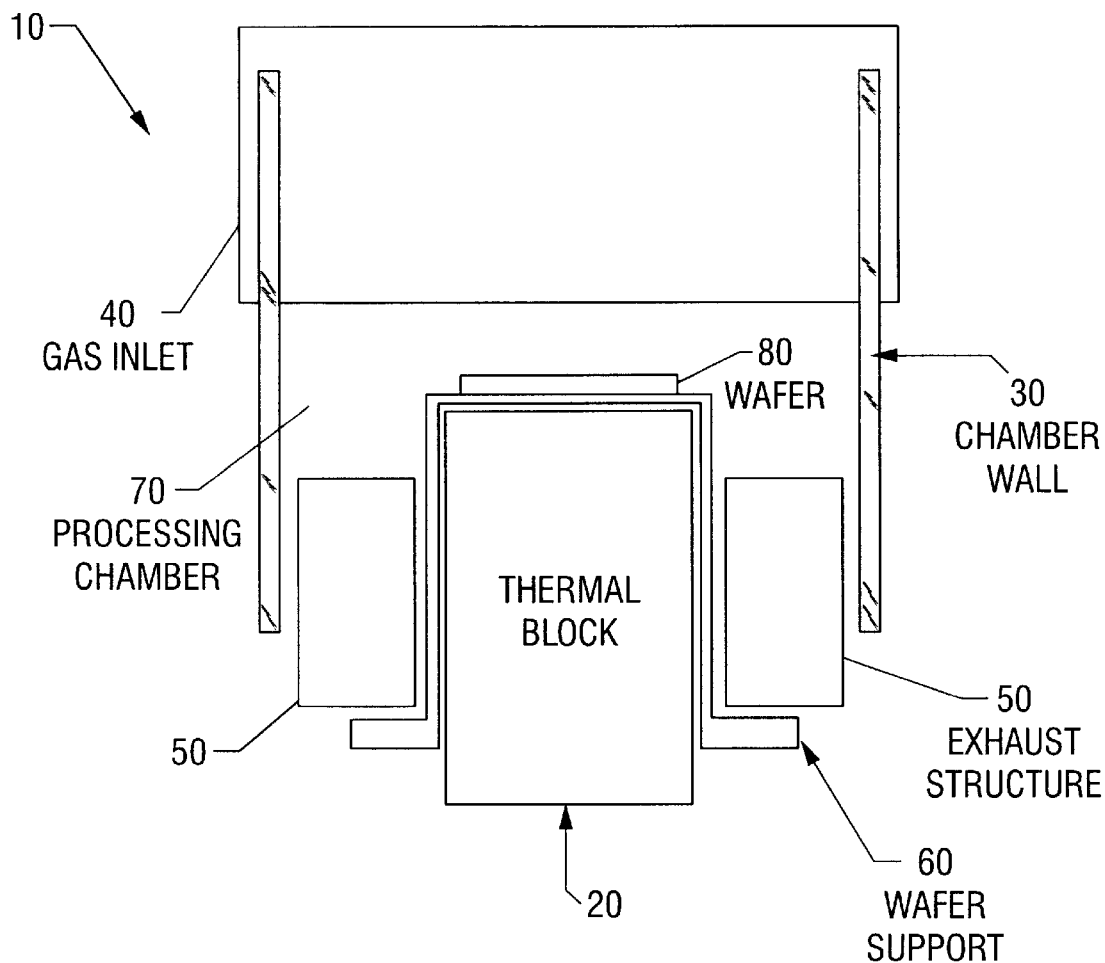
FIG. 1 is a block diagram schematic of a rapid thermal processing system containing a thermal block according to the present invention.

An RTP system according to the present invention is shown as a functional block diagram in FIG. 1. It is to be noted that this figure is strictly a block representation of various reactor subsystems and is not suggestive of actual structural details. For example, the manner in which wafer 80 rests on wafer support 60 is more accurately shown in FIG. 15A. The RTP system includes a reactor 10 which has a closed processing chamber 70 bounded by chamber walls 30, gas inlet structure 40, thermal block 20, exhaust structure 50, and a wafer support 60. The wafer support 60 holds a wafer 80 via a vacuum or other conventional wafer holding means known in the art. The inlet structure 40 may be configured to contain shower heads, injectors and various processing assists as is known in the art. The thermal block 20 may include a heater, temperature sensors, and a chiller unit. In a preferred embodiment of the thermal block, each thermal block 20 includes heater, sensor and chiller elements. However, it will be recognized that aspects of the thermal block may be utilized by use of only a backside heater element or a backside heater element combined with one of the other elements. The exhaust structure 50 is used to permit various gases that are used in processing to exit the reactor structure 10. In a preferred embodiment, the wafer support 60 allows the wafer 80 to rotate during processing to achieve uniform temperature across the wafer. Such rotation of the wafer support 60 helps distribute any non-uniformities in the heat transfer of thermal block 20 in an azimuthal direction around the wafer 80.

Figure 2:
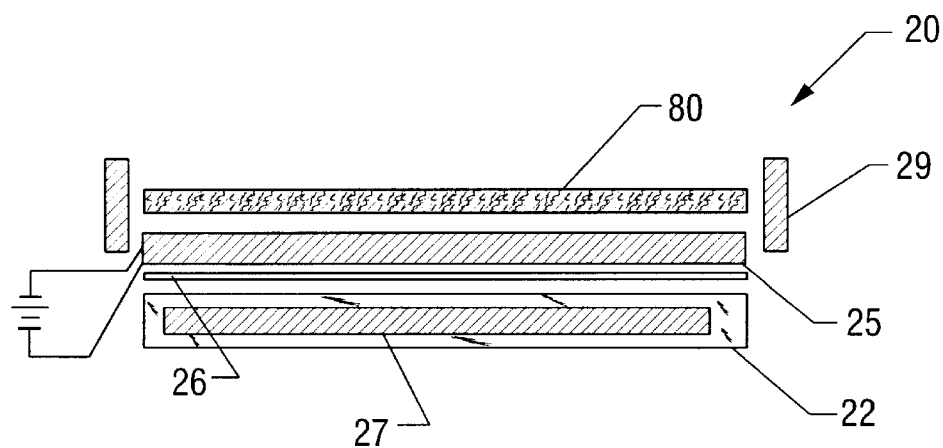
FIG. 2 is a side cross-sectional view of a thermal block having backside cooling and heating.

A side cross-sectional view of the thermal block 20 is shown in FIG. 2. As shown in FIG. 2, this particular embodiment of the thermal block 20 includes a proximity heater 25, chiller unit 27 and edge shields 29. The proximity heater 25 is used to heat the wafer 80 from the backside to the desired processing temperature. This heating process may be controlled by the temperature sensors, which are not shown in FIG. 2. After processing is completed, the chiller unit 27 activates and operates as a heat sink, enabling the wafer temperature to be quickly downramped. Edge shielding 29 is used to promote uniformity of temperature across the surface of the wafer 80, particularly at the edge of the wafer 80. Edge shielding 29 also minimizes thermal stress-induced defect generation at the high temperature processes. The edge shielding 29 serves as a shield against the ambient and further assists in heating the edge of the wafer 80 by acting as a reflector.

Figure 3A:
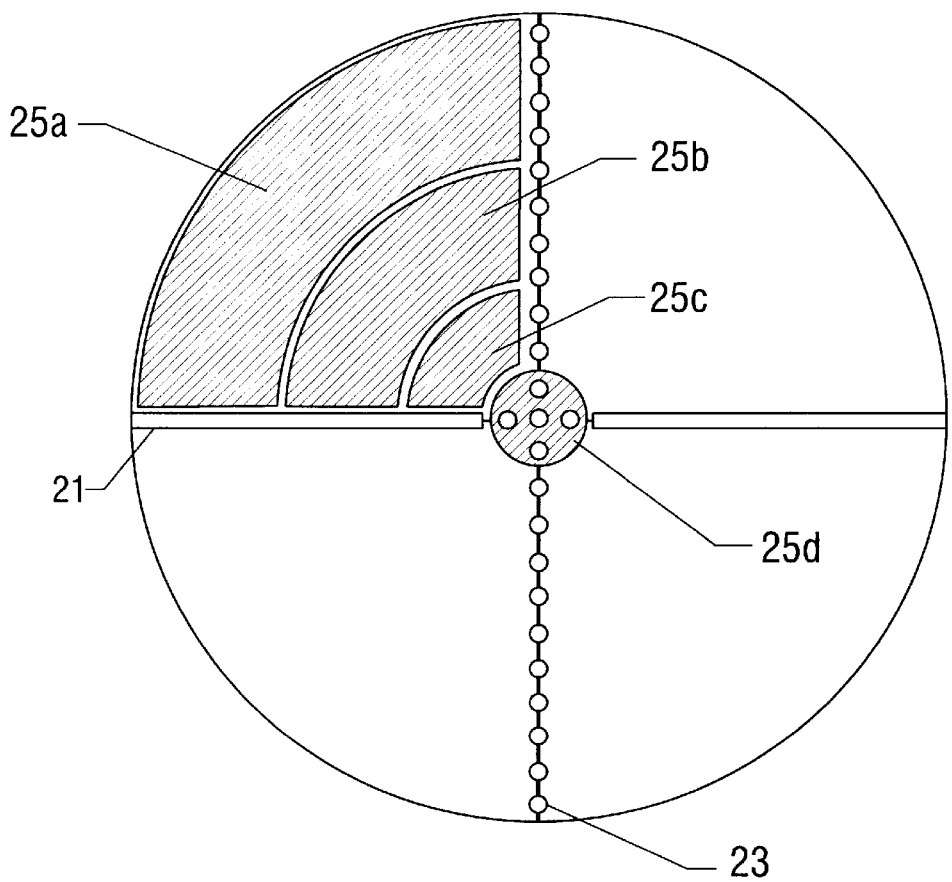
FIG. 3A is a top cross-sectional view of a thermal block.

The heat transfer of the thermal block is controlled by temperature sensors. Two examples of temperature sensor configurations are shown in FIG. 3A, in a top view of the thermal block 20. First, an array of individual temperature sensors 23 can be interspersed among a plurality of proximity heaters 25a–d. Alternately, temperature control may be achieved by use of miniaturized thermopile arrays 21. In a further alternate embodiment, thermopile arrays 21 may be combined with individual point sensors 23. Temperature sensors 23 and thermopile arrays 21 provide real-time temperature information, which is processed to accurately determine the radial temperature profiles across the entire wafer structure. Sensors 23 provide absolute temperature data that yields a pointwise display of the temperature profile, whereas sensors 21 provide relative temperature readings and hence a simple way of monitoring temperature uniformity.

Figure 11:
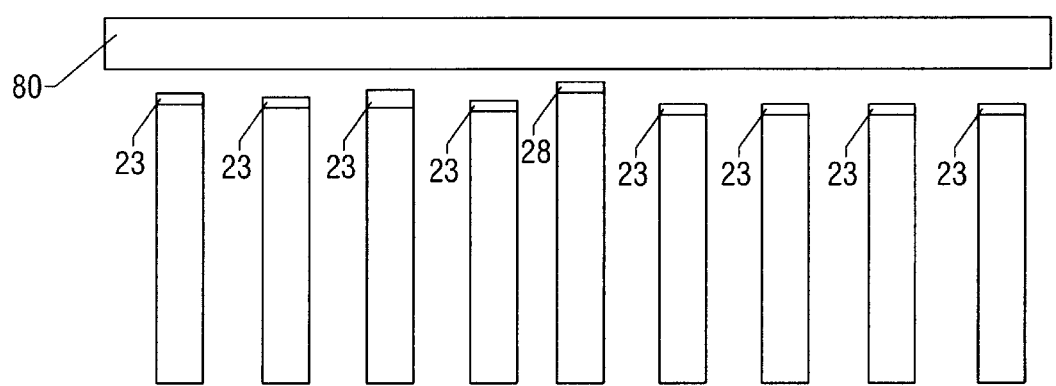
FIG. 11 is a schematic of a multiple sensor configuration.

FIG. 11 stresses the fact that a combination of absolute and relative temperature sensors will suffice for a complete temperature profile determination. In this configuration, for example, one contact sensor 28 is placed at the wafer center and is used to establish an absolute temperature reading. Alternately, the center sensor may be a proximity sensor or pyrometer of sufficient accuracy. The supplementary temperature sensors 23 measure the relative difference between the sensors for the purpose of assuring uniformity across the wafer. Flux meters, for example, may be utilized as supplementary temperature sensors. The sensor configurations shown in FIG. 3A and FIG. 11 both utilize the advantages of temperature sensors integrally combined with the backside thermal block 20. Other sensor and heating configurations within the thermal block 20 will be apparent to those skilled in the art. It will be further noted by those skilled in the art that, in the presence of wafer rotation, each sensor registers an azimuthal temperature average at a given radial position of the wafer.

The thermal block 20 has distinct advantages over prior lamp heating systems for RTP. First, proximity heaters provide for more efficient heating than conventional RTP lamp heaters, in that little thermal radiation passes by the wafer edges. If helium gas is injected under the wafer, there is superior thermal coupling between the wafer and the proximity heaters than between a wafer and lamp heaters. Appropriate combinations of heaters and sensors in the thermal core, as exemplified in FIG. 3A will provide maximum control authority over the radial temperature profile. Also, because they are segmented, individual heater elements 25a–d limit cross-talk between the heaters, further enhancing zonal control. Another advantage of the thermal block 20 is that the entire unit is readily installed and removed from within the wafer support 60, thereby permitting easy access for maintenance functions. Finally, the chiller block allows for faster ramp-down than currently available in present RTP systems, where cooldown generally occurs by radiative losses after turning off the heating lamps.

The inlet structure 40 of FIG. 1 may include a variety of different gas delivery systems, as are known in the art. These systems may be, for example, shower heads with zonal control, combination of shower heads and microvalves, or structures made up entirely from arrays of microvalves. The inlet structure 40, whether it be a water-cooled shower head, or an array of micro-injectors, may include a specular faceplate. The specular faceplate is brought as close as possible to the wafer 80 to suppress radiative pattern effects on the wafer 80. The specular faceplate may be provided with an inlet edge shroud. The inlet edge shroud performs several functions, which will be discussed below.

The various elements and methods of the present invention are described in more detail below.

Proximity Heater

The heater element 25 of FIG. 2 may be, for example, a resistance heating element with a CVD coating of pyrolytic graphite on a pyrolytic boron-nitride (PBN) substrate, such as the Boralectric line of heaters available from Advanced Ceramics Corporation. This heater consists of PBN deposited as a thin layer by CVD and subsequently covered on both sides with pyrolytic carbon, which is finished with a protective layer of boron-nitride (B—N) on both sides. The B—N layer serves as structural support and the carbon as conductor. The graphite is then machined to form a serpentine pattern which is then used as a resistive heating element. It is desirable to utilize a heater element yielding flat surfaces with uniform flux distribution and durable, low-profile terminations. More advanced material may include poly-crystalline diamond in place of the B—N, and metallic conductor layers deposited by patterned CVD. Other modifications will be readily apparent to those skilled in the art.

Figure 4:
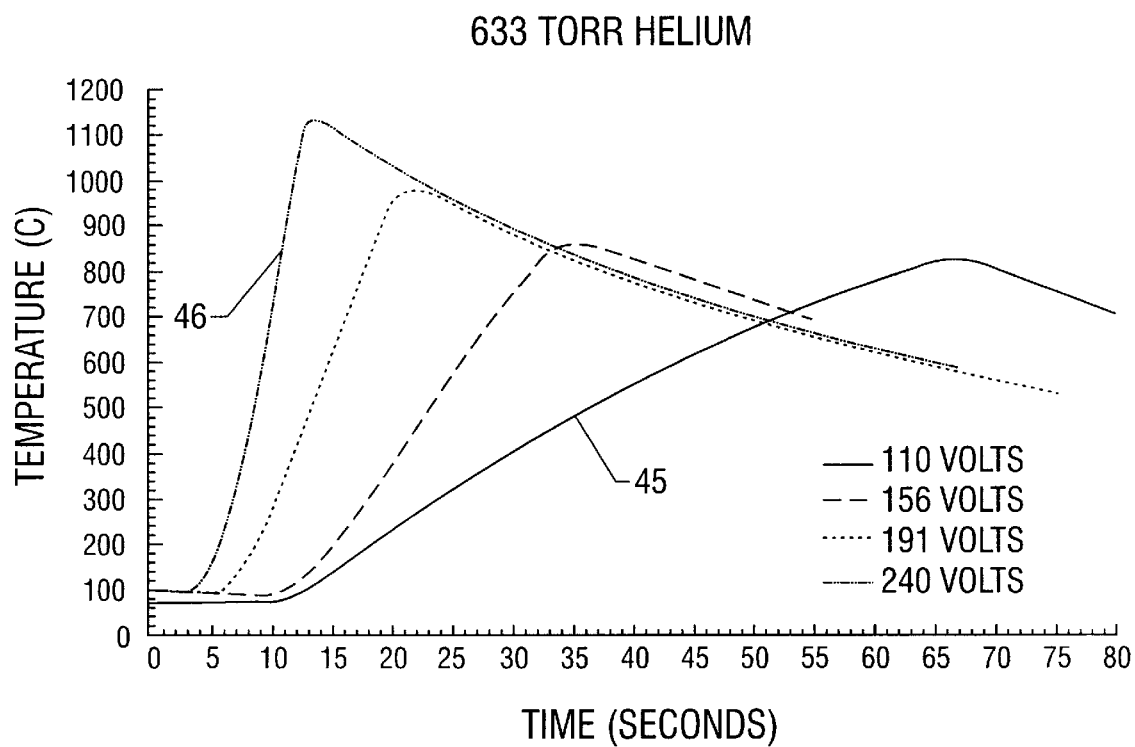
FIG. 4 is a graph of wafer temperature versus time as a function of voltage.

The thermal mass of the heating element is quite small compared to typical thermal CVD because the PBN is relatively thin. For the Boralectric units up to about 4 inches in diameter, the PBN is only about 0.08 inches thick. The heating rate of a standard 4 inch unit is about 4500 watts. This heating rate results in a ramp rate of about 60° C./sec. To increase the ramp rate to about 120° C./sec., the graphite heating elements may be deposited on both sides of the PBN substrate. FIG. 4 shows the transient of wafer temperature (measured in the center of a 4 inch wafer) upon application of full power to the heating element of a Boralectric heater. As seen in FIG. 4, ramp rate increases with the applied voltage, as higher voltage curve 46 increases temperature faster than lower voltage curve 45.

Figure 5A:
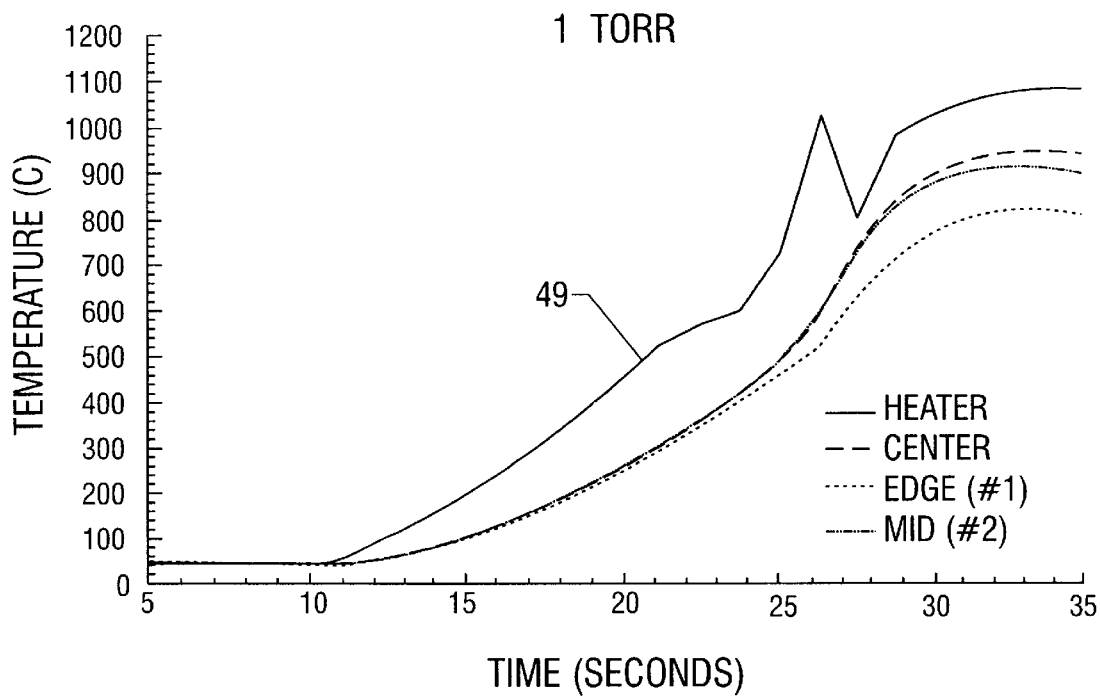
FIGS. 5A and 5B are graphs of wafer temperature versus time as a function of pressure.
Figure 5B:
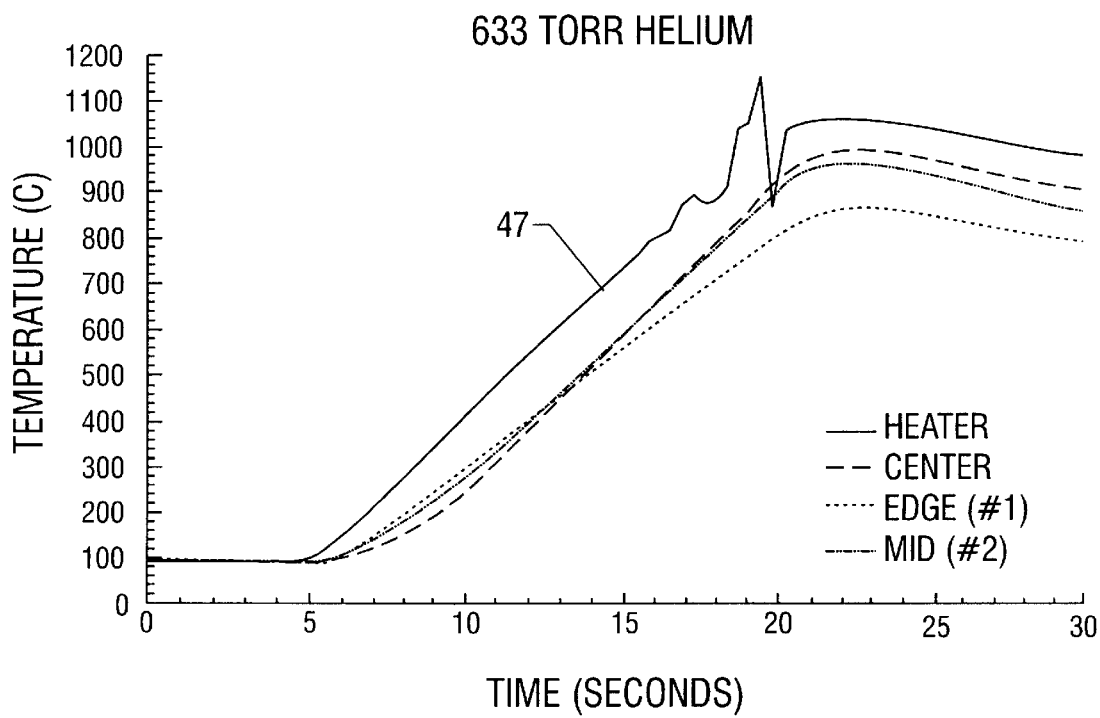

Ramp rate also increases from increased chamber pressure, as is shown in FIGS. 5A and 5B. FIG. 5A shows the heater and wafer temperature as a function of time at a pressure of 1 Torr. FIG. 5B shows the heater and wafer temperature as a function of time at a pressure of 633 Torr. Note that the temperature increases at a slower rate for curve 49 of FIG. 5A than curve 47 of FIG. 5B. This slower ramp rate at lower chamber pressure is due to reduced thermal conductance between the wafer and the heater. However, as the heater and wafer temperature increases during ramp-up, radiative coupling dominates and the impact of the heater/wafer gap and pressure on ramp rate is diminished.

Figure 6:
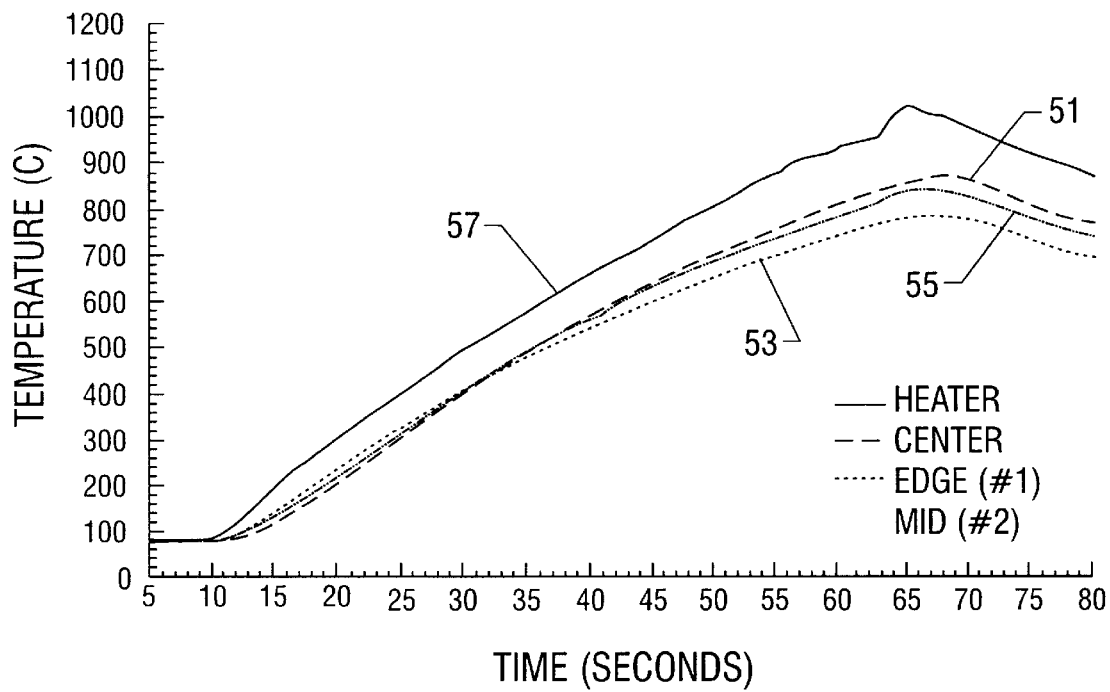
FIG. 6 is a graph of wafer temperature versus time at different positions across a wafer.

FIG. 6 shows the heater and wafer temperature transients at several radial points along the wafer. As seen in FIG. 6, at the beginning of a heating cycle the heater temperature (curve 57) increases first, and the wafer temperature (curve 51) lags behind. This lag is caused by finite thermal resistance between the heater and wafer. The lag of wafer temperature will decrease as thermal resistance decreases. Also as seen in FIG. 6, at the beginning of a heating cycle, the edge of the wafer (curve 53) heats at a faster rate than does the mid and center locations (curves 55 and 51 respectively). This is a result of the relatively small gap at the edge of the wafer and a larger gap in the center, due to a slight bow in the heater. This gap decreases the thermal resistance to heat transfer at the wafer edge compared to the wafer center. However, at temperatures higher than 500° C. to 600° C., the edge becomes cooler compared to the center. This is caused by the heat transfer at higher temperatures becoming dominated by radiation as opposed to conduction through gas in the gap. This is exacerbated by a lack of shielding, the wafer edges against radiative heat loss. As discussed above, edge shielding 29 as in FIG. 2 will raise temperature near the edge of the wafer 80.

Standard heater configurations, such as the Boralectric line of heaters, are not optimized for RTP applications. Present heaters have larger substrate thickness which would reduce ramp rate. Also, radial temperature uniformity may be inadequate. These problems may be overcome by customizing heater elements. For example, solutions may include manufacture of a larger heating element from several smaller units. Further, the distribution of heating could be tailored by design of the graphite conductor pattern, which may provide several independently controlled heating zones. One embodiment of such a design is shown in FIG. 3A, in which the thermal block 20 includes a plurality of heater elements 25, which are shown as heater elements 25a–25d. Though shown in only one quadrant and the center of the cross-section of the thermal block 20, it will be recognized that the heater elements may uniformly cover the cross-section of thermal block 20. Also, FIG. 3A shows that 25d, the center heater element, may contain several holes, in which individual sensors 23 may be placed. The central heater element will be discussed in further detail below.

Proximity Temperature Sensors

Figure 7:
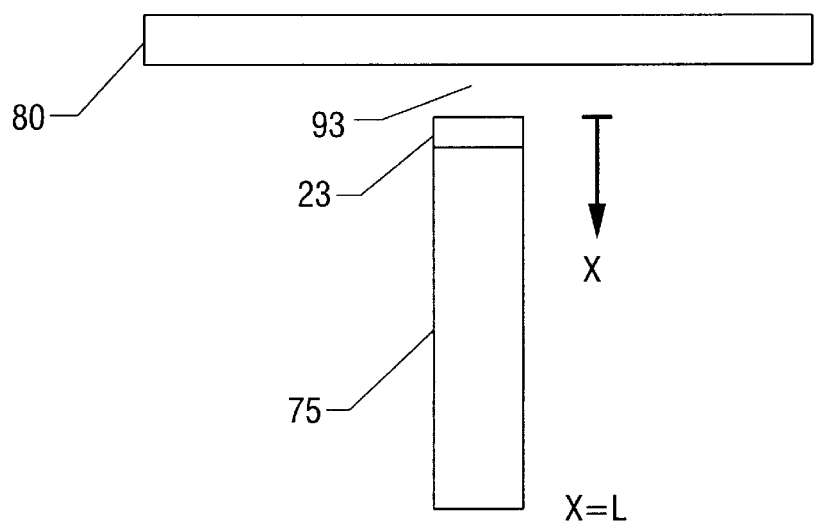
FIG. 7 is a schematic of a proximity sensor.

As can be seen in FIG. 7, the temperature sensors 23 are placed in close proximity without contact to the back surface of the wafer 80. The sensors 23 are specifically configured to thermally couple to the surface of wafer 80. FIG. 7 shows that the temperature sensor 23 will be affixed to a stem 75. The stem 75 may be comprised, for example, of ceramic, and is positioned normal to the wafer 80 backside. The sensor 23 may be, for example, a thermocouple, thermopile, thermistor, or other transducer suitable for this purpose.

FIG. 7 provides a basic thermal model representation of the elements of the proximity sensor configuration. Additional structural details are discussed below. The sensor 23 is located at the tip of the stem 75 (i.e., at X=0), and separated from the wafer 80 by a gap 93. Radiative thermal coupling between the wafer 80 and the sensor 23 and between the wafer 80 and the stem 75 serves to increase the sensor and stem temperatures above ambient. Radiative heat loss from the surface of the stem 75 to the cold ambient and conduction heat transfer to the base of the stem 75, however, tend to lower the stem temperature below the wafer temperature. Since a finite conductivity 73 exists, according to FIG. 8, between the sensor 23 and stem 75, the temperature of the sensor 23 will also be affected. Thermal modeling may account for these various heat transfers in order to estimate the temperature difference between the sensor 23 and the wafer 80, DT:

$$DT=Tw-Tsen$$

where Tw is the temperature of the wafer and Tsen is the temperature of the sensor 23, at the tip of the stem 75 (X=0).

The sensor temperature will be close to the wafer temperature if the thermal conductance between the wafer 80 and sensor 23 is large compared to that between the sensor 23 and its surroundings. For example, if the wafer-to-sensor conductance is 100 times the sensor-to-ambient conductance, then the temperature difference between the sensor 23 and wafer 80 will be only about 7K for a wafer at 1000° C. Moreover, this difference is unidirectional and is therefore amenable to calibration, which will significantly reduce the measurement error.

Certain design criteria of the temperature sensor 23 shape, size, position, and radiation shielding will aid in the reduction of temperature error. A stem 75 of approximately 30 mm in length is generally sufficient to isolate the tip from the thermal boundary conditions at the base. However, the stem 75 length may be between 10 mm and 100 mm, and more preferably between 20 mm and 50 mm. It is desirable that the sensor be in close proximity to the wafer 80, for example between 0.05 mm and 1 mm from the wafer 80, and more preferably between 0.1 mm and 0.5 mm.

A preferred embodiment of the stem 75 will have a low thermal conductivity to reduce measurement error. This thermal conductivity may be, for example between 0.5 W/m-K and 10 W/m-K, and more preferably below 1.0 W/m-K. Also, the measurement error may be reduced by using a hollow stem or separating the sensor 23 at the tip from the bulk of the stem 75. Additionally, reducing the emissivity of the sides of the stem 75 will produce a substantial reduction in the measurement error. A low value of emissivity insulates the sides of the stem 75 against heat loss to the surrounding ambient. For example, a stem emissivity in the range of 0.01 to 0.5 will reduce the measurement error, and a stem emissivity of approximately 0.02 is preferred. Reducing the emissivity of the sides of the stem 75 to a value of lower than approximately 0.02 produces a further additional benefit.

Several other component characteristics also impact measurement accuracy. The emissivity of the sensor 23 may be, for example, between 0.5 and 1.0, and more preferably at a value close to 1.0. It is noted that the variation of measurement error with wafer emissivity is quite significant, therefore, it is desirable to determine the tolerance to which the wafer emissivity must be known.

Figure 8:
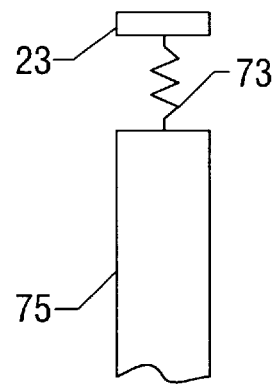
FIG. 8 illustrates a thermal model for a proximity sensor.

Other types of design improvements can also increase the temperature sensing performance. The thermal model of FIG. 8 shows, for example, a temperature sensor 23, a stem 75, and a thermal resistance 73. The purpose of adding a thermal resistance 73 is to thermally isolate the sensor 23 from the tip of the stem 75. This will reduce the thermal coupling of the sensor 23 to the ambient and thereby reduce the temperature measurement error. For example, a significant thermal resistance 73 may be achieved by using a solid cylinder of quartz approximately 1 mm long and 2 mm diameter. This thermal resistance 73 would amount to approximately 300K/watt impeding the flow of heat in the axial direction.

In a preferred embodiment, the thermal resistance may be, for example, a hollow tube of quartz with a diameter of approximately 2 mm and a thickness of approximately 10 microns. The thermal resistance of such a tube would be approximately 16,000K/watt. This increase in thermal resistance is generated by the substantially smaller cross-section available for conduction heat transfer. Also, increasing the length of the tube proportionately increases the resistance. In an alternate embodiment, the sensor 23 may be separated from the tip of the stem 75 by several small posts, which would also increase the thermal resistance if the total cross-section of the posts is smaller than that of the stem. It is noted that most of the benefit of tip resistance occurs at a value between approximately 20,000K/watt to 40,000K/watt.

Another design improvement may be accomplished by injecting certain gases, at suitable pressures into the gap between sensor 23 and wafer 80. This is analogous to the flow of gas to the gap between a wafer and chuck commonly used to control wafer temperature during low pressure CVD and etch processes, and is well known in the art. It is further known in non-RTP applications that an inert gas flow under a wafer support may provide bottom support for a silicon wafer during semiconductor processing. In the present invention, this gas flow provides additional thermal coupling between the wafer 80 and the sensor 23. This thermal coupling will further reduce measurement error. For example, using helium, which has large thermal conductivity on the order of 0.36 W/m-K, substantially decreases the measurement error. To achieve the benefits of gas conduction, a preferred embodiment will keep the wafer-to stem gap small, typically on the order of about 0.1 to 0.2 mm.

Figure 9:
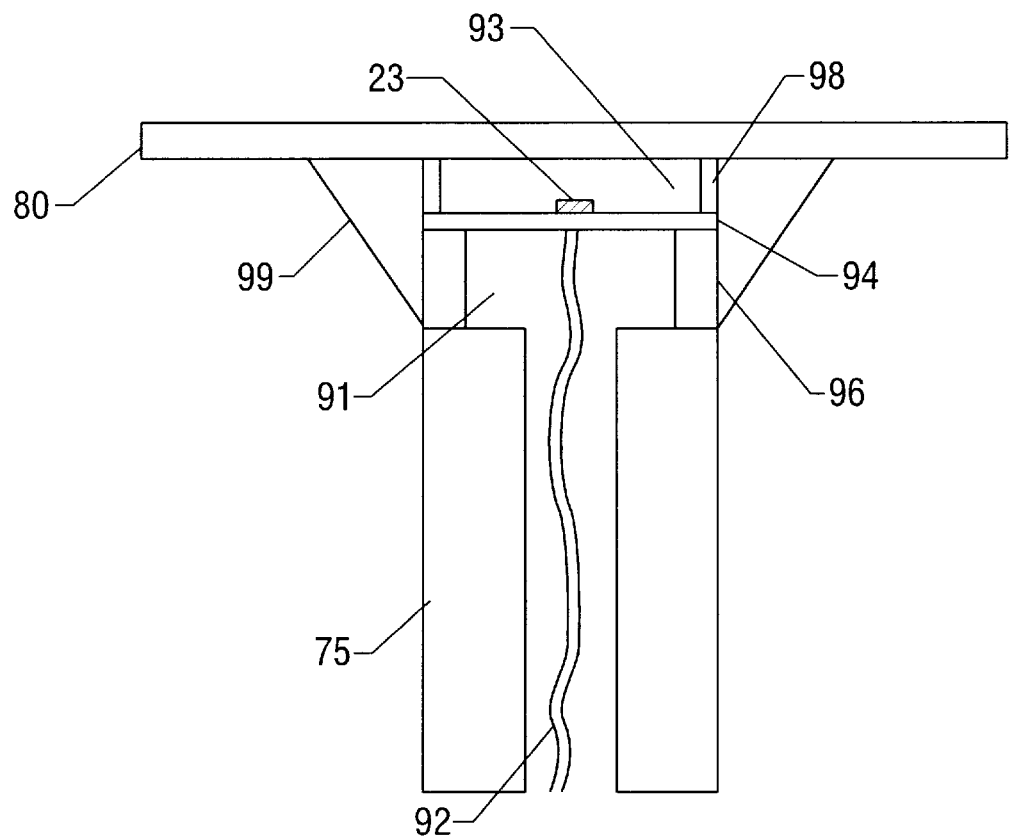
FIG. 9 is a cross-sectional schematic of a passive proximity sensor configuration.

An example of an embodiment for a sensor is shown in FIG. 9. FIG. 9 shows a passive temperature sensor configuration. The term passive denotes the absence of real-time adjustment of the thermal characteristics of the sensor assembly. The sensor stem 75 may be comprised of quartz for low thermal conductivity, which may be on the order of about 1 w/m-K. The stem 75 may be hollow with an inner diameter of approximately 1 mm in order to reduce heat conduction. The interior space also provides a conduit for sensor leads 92. The surface of the stem 75, up to the diaphragm 94, including the diaphragm, and radiation shield 99 is highly reflecting, with a surface emissivity on the order of 0.05. Reflecting radiation shields 99 are positioned so that the tip portion of stem 75 and the sensor 23 are shielded from ambient conditions. Utilizing radiating reflecting shields 99 reduces radiative heat loss from the side of stem 75 by virtue of exposure to the cold ambient. Further, radiation reflecting shields 99 reduce heat transfer to the tip of the sensor 23 by virtue of radiative exchange to the cold ambient through the gap 93 between the tip of the sensor 23 and the wafer 80. The sensor 23 is mounted at the center of a diaphragm 94 which is itself mounted on an annular tube 96 at the top of the stem 75. This tube 96, which may be made of quartz, serves to thermally isolate the sensor 23 from the stem 75. The inside surfaces of the cavity 91 below the diaphragm 94 are highly reflecting to minimize the radiative coupling between the sensor 23 and the stem 75. The cavity 91 will be evacuated to further reduce thermal conductance. Stand-offs 98 of approximately 0.1 mm height are placed on the tip of the stem 75 to control the size of the gap between the wafer 80 and sensor 23 and thus to protect the sensor 23 from contact with the wafer. Stand-offs 98 need only be two small diameter posts and may be made of any low-conductivity material suitable for contact with wafer 80.

Figure 10:
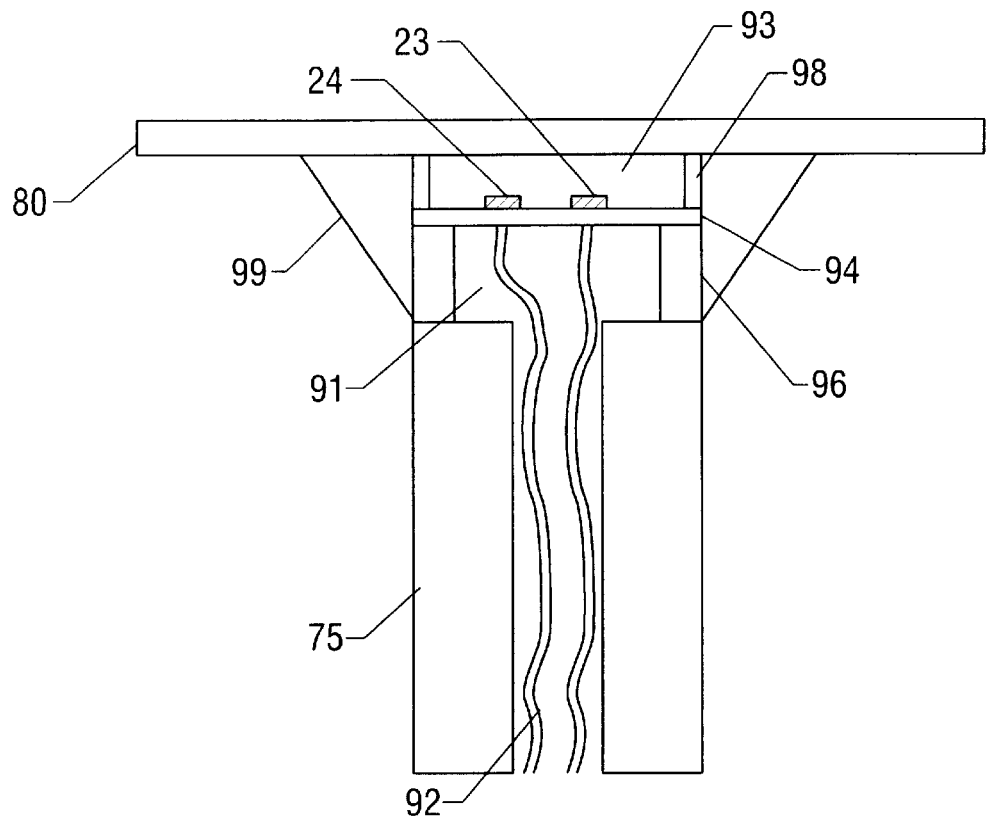
FIG. 10 is a cross-sectional schematic of an alternative passive proximity sensor configuration.

A variation of the embodiment shown in FIG. 9 is shown in FIG. 10. The embodiment of FIG. 10 adds a second temperature sensor 24 which is affixed to the diaphragm 94. In a typical configuration, there is heat loss from the edge of diaphragm 94, through the thermal isolation 96, and into the stem 75. Thus, the temperature at the outer edge of the diaphragm 94 will be lower than that at the center of diaphragm 94. The presence of a second sensor 23 provides for measurement of this temperature difference and estimation of the radial temperature gradient in the diaphragm 94. From this radial gradient, one may estimate the normal gradient toward the wafer 80 by virtue of a suitable heat transfer model. This model also permits estimation of the temperature difference between sensor 23 and wafer 80, by way of physically-based-calibration.

Figure 12:
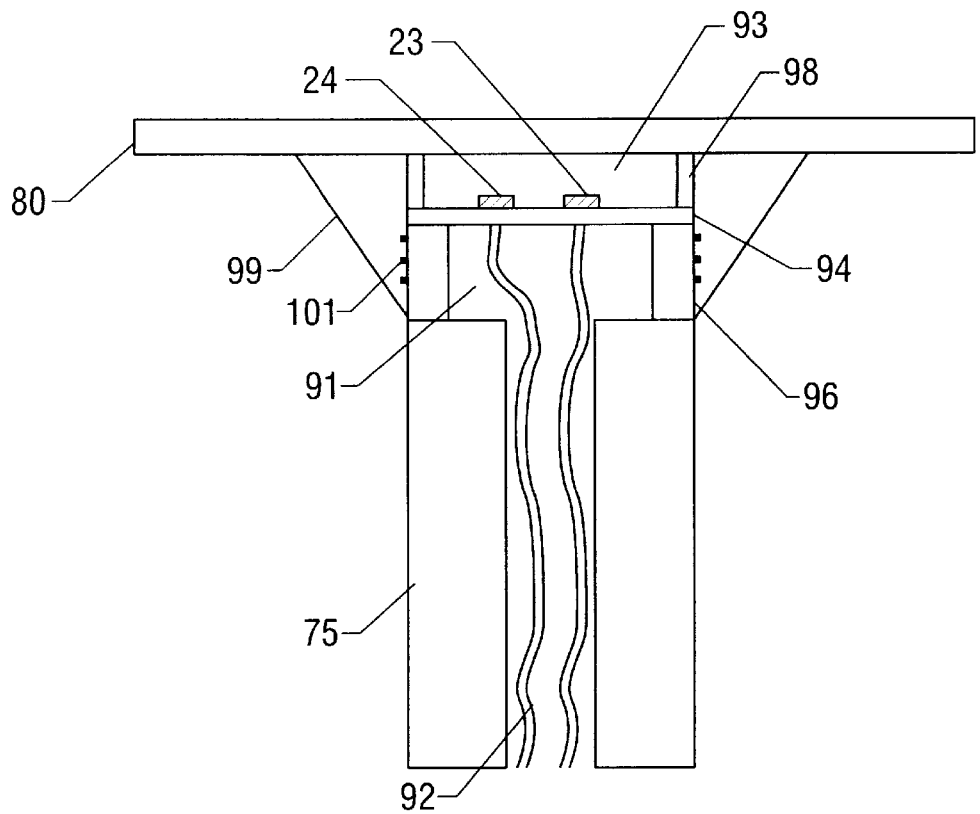
FIG. 12 is a cross-sectional schematic of an active proximity sensor configuration.

Another embodiment of the present invention employs active temperature sensing. Active sensing denotes a sensor system which modifies, in real-time, some thermal characteristic of the sensor in order to reduce the measurement error. An example of a preferred embodiment using active sensing is shown in FIG. 12. The configuration is the same as that in FIG. 10 except for the addition of the miniature heater 101. The miniature heater 101 applies heat to eliminate heat losses from the region surrounding the outer temperature sensor 24. The amount of heat provided by the miniature heater 101 is adjusted to make the temperature at the outer sensor 24 equal to that at the inner sensor 23. The miniature heater 101 may be adjusted in real-time until the temperature of the outer sensor 24 matches that of the inner sensor 23. This active sensor configuration has the effect of reducing the impact of the cold surroundings on the temperature of the sensor 24 and thereby facilitates estimation of the temperature difference between sensor 23 and wafer 80 as part of a physically-based self-calibration.

Chiller Block

As shown in FIG. 2, the chiller block 27 may reside under the proximity heater 25, and is contained within a vacuum enclosure 22 for proper isolation during heat generation. The vacuum enclosure 22, which also encompasses a specular backplane 26 between heater 25 and chiller block 27. The chiller 27 is typically kept at liquid nitrogen temperature. A backflow gas, for example helium, flows above the backplane 26 to provide maximum thermal coupling between heater 25 and wafer 80 at all times. During the cooldown cycle, as heater power is shut down, the chiller enclosure goes from vacuum to helium backfill, thus turning the chiller block 27 into an effective heat sink for the heater 25 and the wafer 80.

An alternative embodiment for the chiller block 27 described above is not shown in FIG. 2. This embodiment uses a wafer support which is sealed at the top with a high-strength, high conductivity diaphragm, such as polycrystalline diamond. This diaphragm carries an integral RF susceptor layer at the top. Just below this diaphragm are RF driving coils, cooled with water or liquid nitrogen. The gap between wafer and diaphragm is charged with helium at all times and the space below the diaphragm is evacuated during heating, but filled with helium during cool-down.

Proximity Heaters/Sensor Arrays for RTP

FIG. 3A is a top cross-sectional view of the thermal block 20. FIG. 3A shows, for example, an array of individual temperature sensors 23 interspersed among a plurality of proximity heaters 25a–25d (collectively heater 25). Though shown in only one quadrant of the cross section, heaters 25a–25d will also be located in each of the remaining three quadrants. The layout of heaters 25a–25d and sensors 23 as shown in FIG. 3A produces segmented wafer temperature fields, whose annular zones can be individually controlled for radial uniformity. The overall layout consists of concentric, annular heater elements, mounted on a specular, refractory substrate for maximum response and efficiency. Proximity heaters may be shaped for maximum coverage of the circular area under the wafer 80, with mutually interlocking serrations at their edges to provide temperature continuity at the joints. Shaping the heaters 25 allows space for temperature sensors 23. As will be readily apparent, the benefits of segmented heaters 25 include cost reductions, ease of producing flat heater surfaces, fail-safe scenarios in case of single element failures and ease of heater replacement.

Figure 3B:
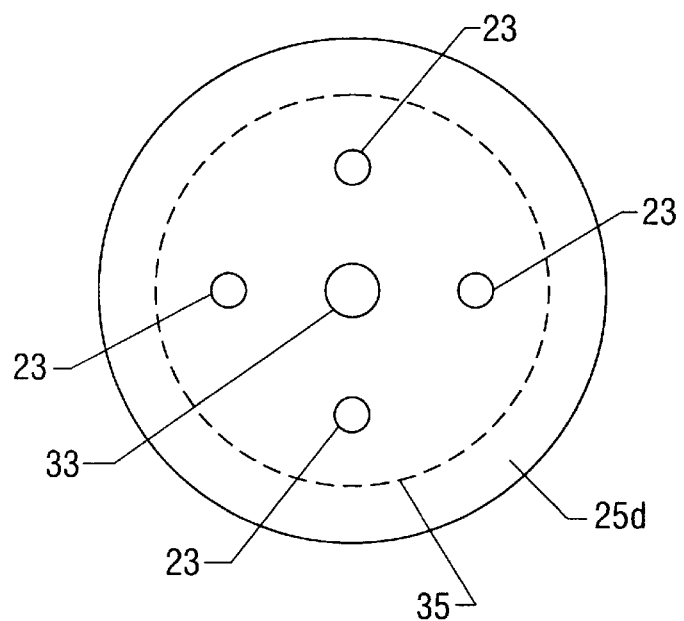
FIG. 3B is a top cross-sectional view of a central heater element.

FIG. 3B is a top cross-sectional view of a close-up of the central heater block 25d. As shown in FIG. 3B, heater 25d may include temperature sensors 23, a central orifice 33, and a central reflector 35. The central orifice 33 permits gas ejection into the gap between wafer 80 and heater 25d. The temperature sensors 23 may be, for example, ripple probes, or they may be proximity sensors. The gas may be, for example, helium. The helium flow serves several purposes. First, it provides thermal conduction between the heater 25 and wafer 80. Second, the axisymmetric stagnation flow can serve as a gas bearing, thereby providing a central support against wafer sag. Third, if the thermal sensors 23 are proximity sensors, the gas flow enhances the thermal coupling to the wafer 80 and the stagnation flow can serve as gap control.

Figure 3C:
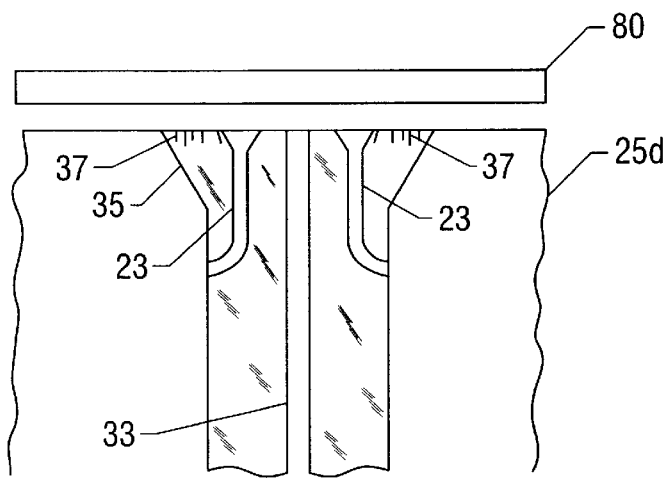
FIG. 3C is a side cross-sectional view of a central heater element.
Figure 13:
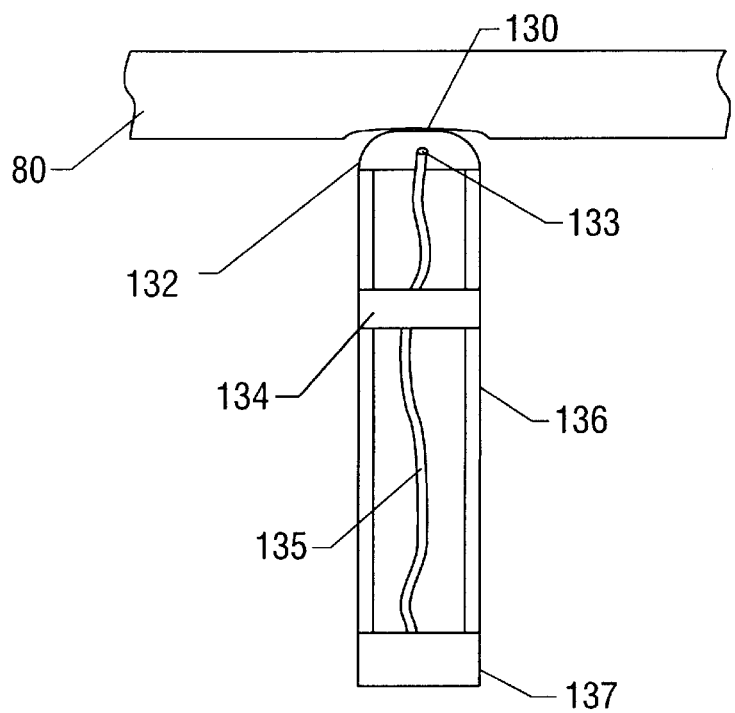
FIG. 13 is a cross-sectional schematic of a contact sensor.

FIG. 3C is a side cross-sectional view of central heater 25d. FIG. 3C shows central orifice 33, temperature sensors 23, and central reflector 35. As discussed above, a gas flow from the central orifice 33 to the wafer 80 enhances the thermal coupling of the temperature sensors 23 to the wafer 80 and can serve as gap control. For example, a capacitance probe that surrounds the capillary orifice 33 can feed back into a micropressure regulator in the capillary. Thereby, a fixed standoff distance can be maintained for the proximity sensors 23, which permits optimal use of their calibration against gap width. This gas flow may be an alternative to certain mechanical center supports, such as a spring-loaded thermocouple, as shown in FIG. 13. The central reflector 35 may be, for example, a flat reflective shield which faces the wafer 80 underside. A set of concentric microgrooves 37 may be placed around the edge of central reflector 35. These microgrooves 37 are used to minimize radiative leakage into and out of the gap between the sensor 23 and the wafer 80.

Temperature control may be achieved by, for example, use of individual temperature sensors 23 and/or miniaturized thermopile arrays 21 as shown in FIG. 3A. Temperature sensors 23 and thermopile arrays 21 provide real-time temperature information, which is processed to accurately determine temperature profiles along the wafer radius. Since the wafer is assumed to be rotating, azimuthal temperature uniformity (i.e. axisymmetry) can be taken for granted and only the radial profile needs control.

Local temperature data can be processed by a recursive estimation algorithm that updates surface emissivities, if necessary, together with temperatures. This real-time data processing can be integrated with a multivariate control algorithm that holds wafer temperature to the necessary space/time tolerances.

Combinations of Central Sensors and Radial Sensor Arrays

FIG. 11 depicts the combination of a central sensor with radial sensor arrays. In this configuration, the central sensor is used to establish an absolute temperature reading. The center sensor may be a proximity sensor of sufficient accuracy. The supplementary temperature sensors 23 measure the relative difference between them for the purpose of assuring uniformity across the wafer. The outputs from these supplemental temperature sensors 23 need not be absolute temperatures, but merely relative readings. These readings may be utilized to ensure that the temperature differences between supplemental temperature sensors 23 are within the required uniformity tolerances. Flux meters, for example, may be utilized as supplementary temperature sensors. The sensor configuration of FIG. 11 utilizes the advantages of temperature sensors integrally combined with the backside thermal block. It will be noted by those skilled in the art that in the presence of wafer rotation, each sensor registers an azimuthal temperature average at a given radial position of the wafer.

In an alternative embodiment of the invention, center temperature sensor 28 is a contact sensor, which may be a thermocouple. In past thermocouple systems, it has been noted that there is a problem of variability of thermal contact between two static surfaces due to the irreproducibility of engagements between their asperities from one "touch" to the next. The present invention utilizes a type of tribological averaging between the two mating surfaces, due to wafer rotation, to arrive at a reproducible heat conduction coefficient between them for purposes of temperature measurement. Other sensor and heating configurations within the thermal block 20 will be apparent to those skilled in the art.

FIG. 13 shows a cross-section of a thermocouple configuration utilizing tribological averaging. This configuration may include a cap 132, a thermocouple 133 embedded within the cap 132, and its leads 135. The leads 135 are enclosed within capillary support 136. A spring 137 or other pressure means, allows the cap 132 to make contact with the wafer 80. The cap 132 may be a spherical, polished cap. This cap 132 then becomes the actual contact with the wafer 80. The cap 132 may be, for example, made of silicon. By manufacturing the cap 132 from silicon, contamination problems with the silicon wafer 80 are prevented. To minimize particle generation from the contact of the cap 132 with the wafer 80, both surfaces may be circularly buffed, as is shown at point 138 on the wafer 80.

To ensure proper contact of the cap 132 with the wafer 80 when the wafer 80 is not rotating, the support 136 may be equipped with, for example, a small PZ crystal 134 that imposes torsional vibrations on the tip. If, however, the wafer 80 is rotating and the sensor cap 132 bears against it under spring loading, torsional excitation of the cap 132 may not be necessary.

Real-Time Recursive Temperature Estimation and Control

To fully realize the potential of the zonal feedback of the proximity heater and temperature sensor array, modern real-time, recursive data processing techniques with sampling rates of 100 to 1000 Hz are desirable. Such techniques will allow dynamic tracking and control of the radial wafer temperature profile as a multi-variable system. Numerical algorithms required will include data averaging between redundant sensors at a given radius, failure detection for individual transducers, and discrimination of statistical "outliers" (possibly due to sensor aging). Moreover, the layout of heating zones must compromise between maximizing local control authority and preserving continuity of the temperature profile between heating zones.

Motor Assembly for Rotating Wafer Support

Figure 14A:
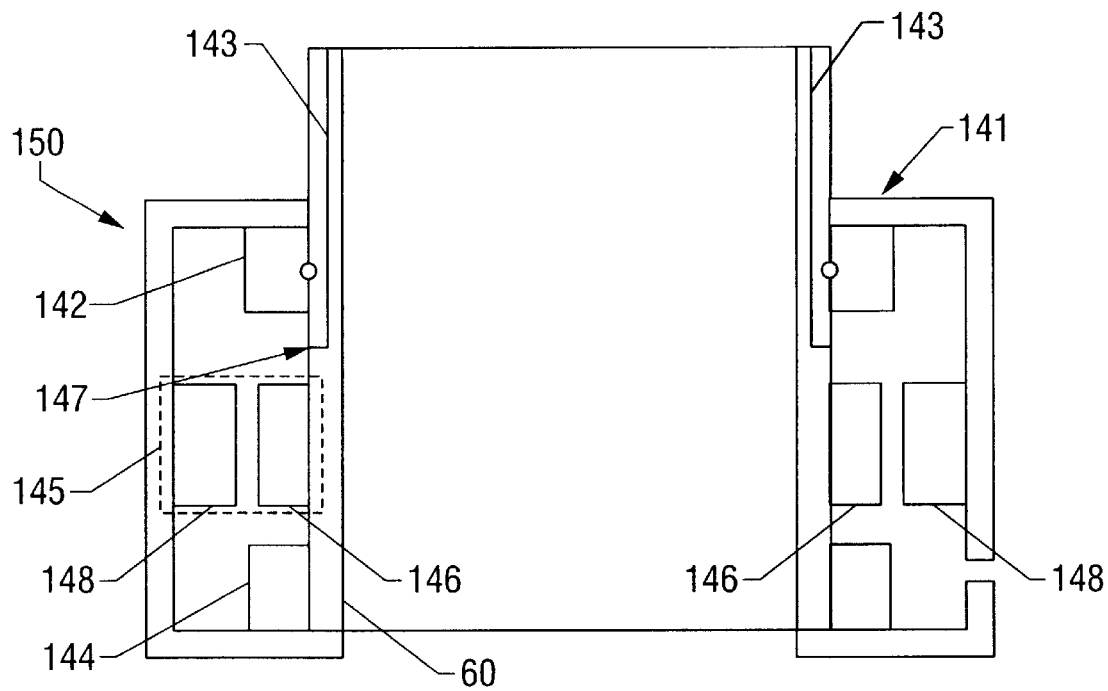
FIGS. 14A and 14B are cross-sectional schematics of the bottom portion of a wafer support mechanism.

As shown in FIG. 1, a wafer 80 is supported by the wafer support 60. FIG. 14A shows a cross-sectional view of the lower part of the wafer support 60. The wafer support 60 is rotated by the drive assembly 150, which is designed to provide rotary speeds up to 1200 rpm. Rotating the wafer support at such a high speed provides the advantage of a fluid dynamic effect. Specifically, gases introduced by inlet structure 70 are forced to the outer edge of wafer 80, primarily because of the centrifugal force caused by the rotating wafer 80. The effect of the rotating wafer 80 therefore allows for a uniform gas flow across the surface of the wafer 80. The drive system 150 may include an upper ferro-fluidic bearing and seal assembly 142, a lower ferro-fluidic assembly 144, and a D.C. drive motor 145. As shown in FIG. 14A, the motor 145 is mounted between the two assemblies, 142 and 144. The D.C. motor 145 includes a rotor 146 and stator 148. The rotor 146 is mounted integrally on the wafer support 60. The entire drive assembly 150 is located outside the wafer support 60. This space between the two ferro-fluidic seal blocks, 142 and 144, is closed off as a vacuum plenum which draws on an array of vacuum ports 147 in the wafer support 60. These vacuum ports 147 connect into vertical interior channels 143 that run to the top of wafer support 60 and serve as supply lines for the wafer hold-down. The upper ferro-fluidic assembly 142 is the primary seal for the chamber ambient, whereas lower ferro-fluidic assembly 144 confines the ambient of the thermal block 20. At the same time, the two seals contain the vacuum ports within the vacuum jacket 141, which activate the vacuum supply lines 143 for the wafer hold down nozzles 140, which are shown in FIG. 15, around the top edge of the wafer support 60.

Figure 14B:
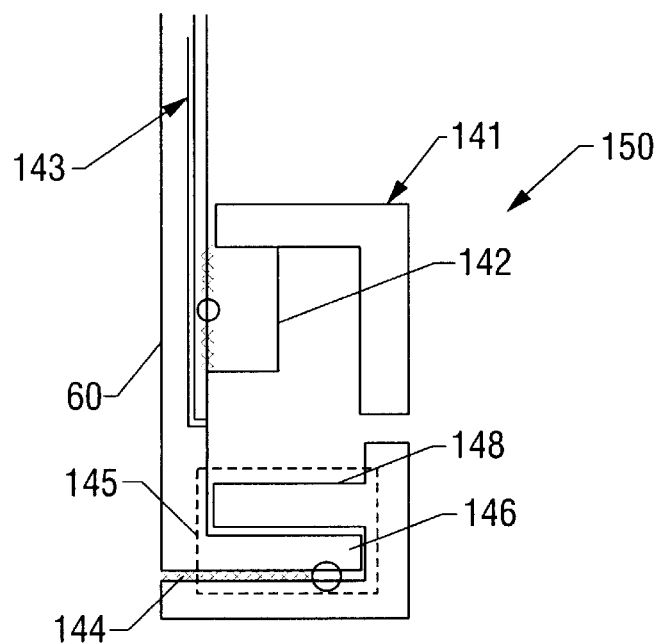

As is known to those skilled in the art, the ferro-fluidic bearing/seal units 142 and 144 contain a viscous fluid with suspended magnetic particles. In the present invention, this fluid forms the seal between the wafer support 60 and parts of the vacuum jacket 141, which is part of the stationary chamber structure. The fluid volume is held in place with an external magnetic field. By positioning the ferro-fluid seals 142 and 144 on the process side of the bearings, particles which are generated by the bearings are shielded from the process. A drawback to this bearing seal design is the presence of fluid drag. However, this problem can be overcome by proper selection of a drive motor 145. As shown in FIGS. 14A and 14B, the drive motor 145 may be of an annular construction. To provide modular construction for a wide variety of applications, the drive assembly can be installed as a unit into the reactor chamber 70. Other configurations of the drive assembly 150 will be readily apparent to those skilled in the art.

For example, FIG. 14B shows an alternate embodiment of the drive assembly 150. As shown in FIG. 14B, rotor 146 may be an integral part of wafer support 60. The wafer support 60 passes through the circular ferro-fluidic bearing/seal assembly 142. The bearing/seal assembly 142 is used to allow relatively free motion, to maintain tight rotational tolerances, and to provide a seal block between the ambient atmosphere and the environment in the process chamber 70 of FIG. 1. As shown in FIG. 14B, the bearing/seal assemblies 142 and 144 are annular components. The drive motor rotor magnets 146 are attached to the bottom seal/bearing assembly 144. The stator magnets 148 and the rotor magnets 146 provide the required torque needed to rotate the wafer support 60. The wafer support 60 is capable of rotating at a nominal rate of greater than 1000 rpm, and preferably at 1200 rpm, and can attain that speed within 5 seconds.

Wafer Confinement and Edge Heating on Wafer Support

Figure 15A:
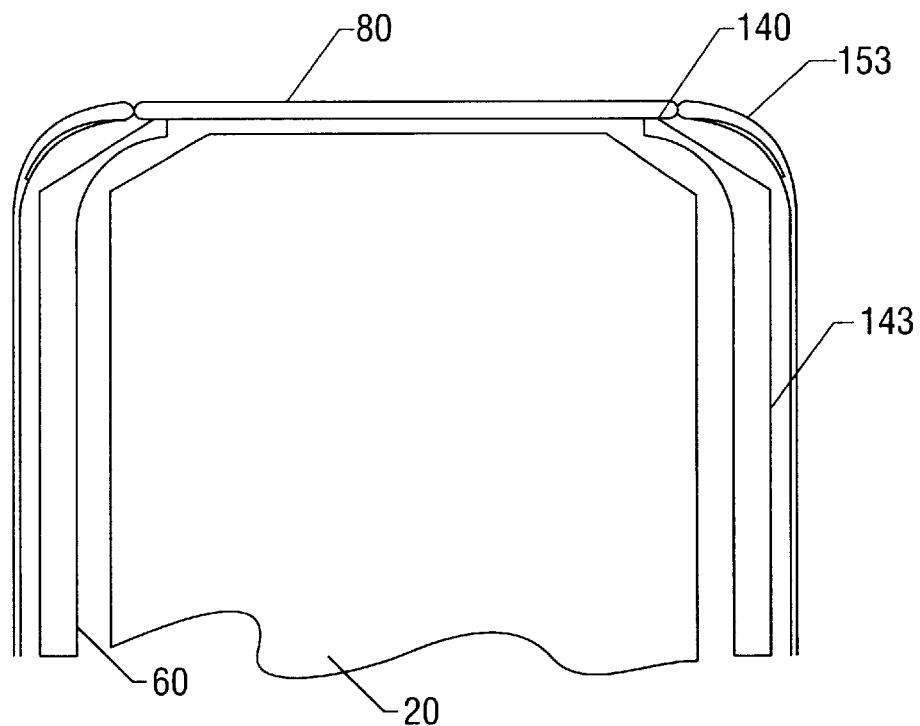
FIG. 15A and 15B are cross-sectional schematics of the top portion of a wafer support mechanism.
Figure 15B:
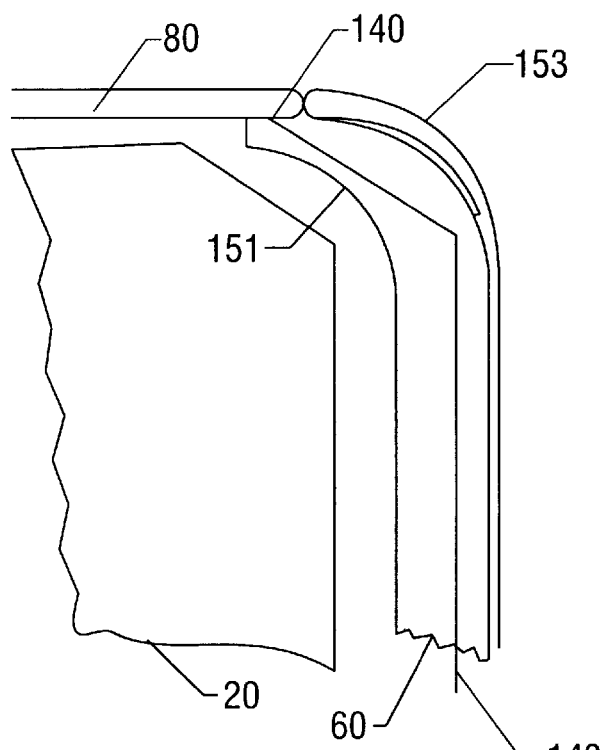

FIG. 15A shows a cross-section of the top portion of wafer support 60, which is typically made of fused silica. FIG. 15B shows a close-up cross-section of the edge of wafer support 60. As is shown in FIG. 15A, wafer 80 rests on top of wafer support 60. The thermal core 20 is located within the wafer support 60. As shown in FIG. 15B, the top portion of wafer support 60 has an inward curved surface 151 and may be polished to admit heat radiation which is then reflected by the shroud 153 toward the edge of the wafer 80. Hold-down of the wafer 80 is accomplished by vacuum lines 143, leading to the nozzles 140. The curved nature of the surface 151 provides full exposure of the edge of wafer 80 to the outer heating elements by acting as a collector of heat radiated from the edge elements of the thermal block 20 and transmitting it to the edge of wafer 80 by a waveguide effect. The top of wafer support 60 may be made of a low-expansion material, for example, fused silica or quartz to minimize thermal expansion and to isolate the lower part of wafer support 60 from process temperatures. The lower portion of wafer support 60 may be made of metal, for example, stainless steel.

A preferred embodiment of the wafer support 60 will also include a stainless steel shroud 153 as shown in FIGS. 15A and 15B. The shroud 153 is curved and is positioned to cover the top of wafer support 60. Also, the shroud 153 is substantially hollow and is comprised of an upper and lower skin, thereby minimizing conduction to the outside. Shroud 153 performs several functions. First, it assists in heating the edge of wafer 80 by acting as an interior reflector. Further it also provides some insulation of the top of wafer support 60 toward the ambient, thereby reducing parasitic deposition on the outer surface of wafer support 60. Also, if periodic plasma cleaning of the area is required, the shroud 153 can serve as ground terminal against a matching electrode on the inlet structure 40 of FIG. 1. Finally, the shroud also serves as lateral confinement of the wafer edge, as well as streamlining the gas flow over the edge and thereby minimizing edge separation.

Vacuum lines 143 are located internal to wafer support 60. In operation, vacuum lines 143 enable the wafer 80 to be held to the wafer support 60 during processing. Also, vacuum lines 143 serve to scavenge helium leakage around the wafer edge from inside and chamber gases from outside the wafer support 60. A preferred embodiment of wafer support 60 may provide, for example, helium backpressure to the backside of wafer 80 to reduce gravity sag. Alternatively, a membrane, such as a CVD diamond membrane, may be installed under the wafer 80 to simplify wafer support against gravity and helium containment. It will be noted by those skilled in the art that, if implemented without such a membrane (depending on the chamber pressure and edge confinement), the wafer support 60 will essentially float the wafer 80 on a gas cushion.

Shower Head Edge Confinement

The inlet structure 40 of FIG. 1 may include a variety of different gas delivery systems, as are known in the art. These systems may be, for example, shower heads with zonal control, combination of shower heads and microvalves, or structures made up entirely from arrays of microvalves.

Figure 16:
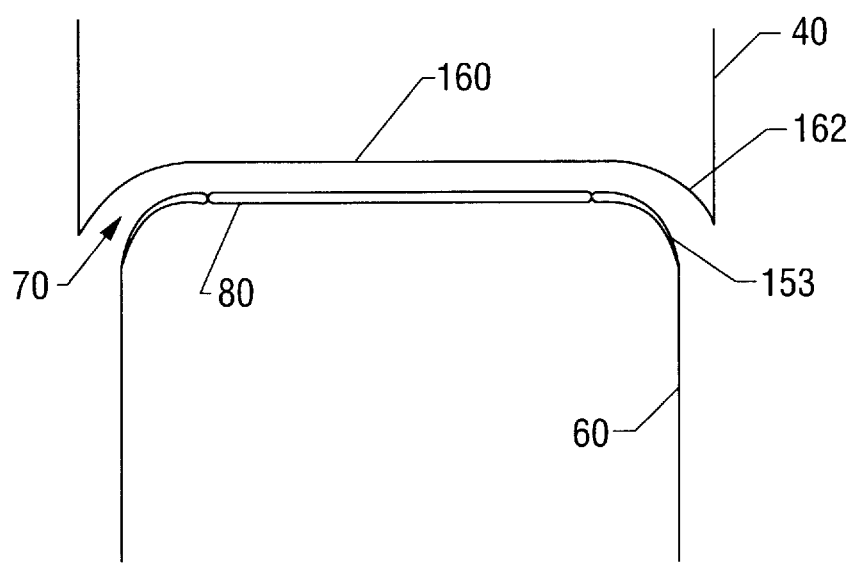
FIG. 16 is a cross-sectional schematic of an inlet structure.

A cross-sectional schematic of an inlet structure 40 is shown in FIG. 16. The inlet structure 40, whether it be a water-cooled shower head, or an array of micro-injectors, will include a specular faceplate 160 as in FIG. 16. The specular faceplate 160 is brought as close as possible to the wafer 80 to suppress radiative pattern effects on the wafer 80. The specular faceplate 160 may be provided with an inlet edge shroud 162. The inlet edge shroud 162 performs several functions. First, being curved downward, the inlet shroud 162 will help to deflect the gas flow around the edge of the wafer support 60, thereby maintaining a laminar flow. Also, the inlet shroud 162 will provide additional radiative confinement of the wafer edge by acting as a blocking reflector, thereby reducing radiative losses from the edge of wafer 80. Finally, the inlet shroud can be the matching electrode for the shroud 153 of wafer support 60 during plasma cleaning, as the concave shape of the edge shroud 162 conforms to the convex shape of shroud 153.

In a preferred embodiment of the inlet structure 40, inlet flows may be controlled by programmed sets of micro-injectors. The micro-injectors will deliver the reactants to the wafer 80. These micro-injectors may be arranged in a number of ways. A preferred arrangement would depend upon the actual design of the chamber 70. The arrangement may be further optimized using fluid dynamics computations. Carrier gas may flow down between the injectors from a suitable inlet plenum. Further, the open head room in the chamber 70 may be utilized as access for various processing assists, such as UV illumination and (IR) laser beams. Other process configurations of the inlet structure 40 will be apparent to those skilled in the art.

Further modification and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the shape, size, and arrangement of parts. For example, equivalent elements or materials may be substituted for those illustrated and described herein, and certain features of the invention may be utilized independently of the use of other features, all as would be apparent to one skilled in the art after having the benefit of this description of the invention.

What is claimed is:

1. An apparatus for rapid thermal processing of a semiconductor wafer having a front side and a backside, comprising:

a plurality of concentric heating elements in opposite relation to the backside of the semiconductor wafer and in close relation thereto; and a plurality of sensing elements in opposite relation to the backside of the semiconductor wafer and in close relation thereto and disposed at various radial positions between the plurality of concentric heating elements.

2. An apparatus as claimed in claim 1 in which the close relation of the semiconductor wafer and sensing elements thereby provides radiative coupling between said semiconductor wafer and said sensing elements.

3. An apparatus for rapid thermal processing of a semiconductor wafer having a front side and a backside, comprising:

a plurality of heating elements opposing the backside of the semiconductor wafer and in close relation thereto; and an array of individual sensing elements interspersed among said plurality of individual heating elements.

4. An apparatus as claimed in claim 3 in which the array of individual sensing elements comprises at least one absolute sensing element.

5. An apparatus as claimed in claim 3 in which the array of individual sensing elements comprises a plurality of relative sensing elements.

6. An apparatus as claimed in claim 3 in which the array of individual sensing elements comprises at least one absolute sensing element and at least one relative sensing element.

7. An apparatus as claimed in claim 3 in which the array of individual sensing elements include thermopile arrays.

8. An apparatus as claimed in claim 3 in which the array of individual sensing elements is a radial sensor array.

9. An apparatus as claimed in claim 8 in which the radial sensor array comprises a central sensor and a plurality of supplemental sensors.

10. An apparatus as claimed in claim 9 in which the central sensor is an absolute sensor and the plurality of supplemental sensors are relative sensors.

11. An apparatus as claimed in claim 4 in which the at least one absolute sensing element comprises a contact sensor or a sufficiently accurate proximity sensor.

12. An apparatus as claimed in claim 11 in which the contact sensor is a thermocouple.

13. An apparatus as claimed in claim 12 in which the thermocouple utilizes tribological averaging, thereby maintaining a reproducible heat conduction coefficient between the thermocouple and the semiconductor wafer backside.

14. An apparatus as claimed in claim 11 in which said contact sensor is embedded within a cap, wherein said cap contacts the semiconductor wafer backside.

15. An apparatus as claimed in claim 14 in which said cap is silicon.

16. A method of rapid thermal processing of a semiconductor wafer, comprising:
providing a rapid thermal processing apparatus having a reaction chamber which includes a plurality of heating elements and a plurality of sensing elements;
placing the semiconductor wafer within the reaction chamber;
heating the semiconductor wafer to a desired operating temperature by means of said plurality of heating elements; and
determining temperature at a plurality of radial positions of the semiconductor wafer by means of said plurality of sensing elements, the sensing elements being disposed at various radial positions between the plurality of heating elements and radiatively coupled to a backside of the semiconductor wafer.

17. A method of decoupling heating zones in a rapid thermal processing system for processing a semiconductor substrate, comprising:
providing a rapid thermal processing apparatus including a plurality of backside heating elements and a plurality of backside sensing elements radially interposed between said plurality of heating elements;
sensing a temperature of a backside of said semiconductor substrate at a plurality of locations of the semiconductor substrate with the sensing elements; and
controlling the plurality of heating elements as a result of said sensing step to provide substantially uniform heating to the semiconductor substrate.

18. An apparatus for rapid thermal processing of a substrate having a front side and a backside, comprising:
at least one heating element opposing the backside of the substrate; and
a plurality of sensing elements opposing the backside of the substrate, the sensing elements being disposed at various radial positions in relation to the heating element.

19. The apparatus of claim 18 wherein said at least one heating element is in close relation to the backside of the substrate.

20. The apparatus of claim 18 wherein said plurality of sensing elements is in close relation to the backside of the substrate.

21. An apparatus as claimed in claim 20 in which the close relation of the substrate and the plurality of sensing elements thereby provides radiative coupling between said substrate and said plurality of sensing elements.

22. An apparatus as claimed in claim 18 in which the at least one heating element comprises a plurality of heating elements.

23. An apparatus as claimed in claim 22 in which said plurality of heating elements are interlocked together by edge serrations.

24. An apparatus for rapid thermal processing of a substrate having a front side and a backside, comprising:
a central heating element having at least one integral sensing element, located opposite to the backside of the substrate.

25. The apparatus of claim 24 in which said central heating element further comprises an integral orifice, thereby permitting a gas flow into a space between said central heating element and said substrate backside.

26. The apparatus of claim 26 wherein said gas flow is helium.

27. The apparatus of claim 25 wherein said integral orifice further comprises a probe capable of measuring pressure, thereby aiding in maintaining a fixed distance between said at least one integral sensing element and said substrate backside.

28. The apparatus of claim 24, further comprising an integral reflector surrounding said at least one integral sensing element.

29. The apparatus of claim 28, further comprising a set of grooves located around an edge of said integral reflector.

* * * * *

UNITED STATES PATENT AND TRADEMARK OFFICE
CERTIFICATE OF CORRECTION

PATENT NO.   :   5,881,208
DATED        :   March 9, 1999
INVENTOR(S)  :   Geyling et al.

It is certified that error appears in the above-identified patent and that said Letters Patent is hereby corrected as shown below:

In claim 26, column 16, line 36, delete "26", and insert the following therefor: -- 25 --.

Signed and Sealed this

Twentieth Day of July, 1999

Attest:

Q. TODD DICKINSON

*Attesting Officer*    *Acting Commissioner of Patents and Trademarks*